US007311937B2

(12) United States Patent
Hashimoto

(10) Patent No.: US 7,311,937 B2
(45) Date of Patent: Dec. 25, 2007

(54) METHOD FOR FORMING A LINE PATTERN, LINE PATTERN, AND ELECTRO-OPTIC DEVICE

(75) Inventor: Takashi Hashimoto, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/283,303

(22) Filed: Oct. 30, 2002

(65) Prior Publication Data

US 2003/0085057 A1    May 8, 2003

(30) Foreign Application Priority Data

Oct. 31, 2001   (JP)   ............... 2001-335567

(51) Int. Cl.
   B05D 5/12   (2006.01)
   B05D 3/02   (2006.01)
   B05D 5/00   (2006.01)

(52) U.S. Cl. ............... 427/117; 427/383.1; 427/286; 427/123; 427/199

(58) Field of Classification Search ............... 427/58, 427/96, 123, 197, 199, 284, 286, 376.2, 383.1, 427/118, 380; 101/129, 488
   See application file for complete search history.

(56) References Cited

U.S. PATENT DOCUMENTS

| 3,831,342 | A | * | 8/1974 | Rejsa ............... 53/491 |
| 4,664,945 | A | * | 5/1987 | Maeda et al. ............... 427/98.4 |
| 4,891,242 | A | * | 1/1990 | Ito et al. ............... 427/98.5 |
| 5,132,248 | A | * | 7/1992 | Drummond et al. ......... 505/325 |
| 5,416,274 | A | * | 5/1995 | Ushiyama et al. ......... 174/250 |
| 6,207,234 | B1 | * | 3/2001 | Jiang ............... 427/333 |
| 6,407,345 | B1 | * | 6/2002 | Hirose et al. ............... 174/261 |
| 6,531,191 | B1 | * | 3/2003 | Notenboom ............... 427/554 |
| 6,599,582 | B2 | * | 7/2003 | Kiguchi et al. ............... 427/466 |
| 6,605,315 | B1 | * | 8/2003 | Ozono et al. ............... 427/96 |
| 6,706,234 | B2 | * | 3/2004 | Huang ............... 264/435 |
| 6,733,868 | B1 |   | 5/2004 | Kanbe et al. |
| 6,877,853 | B2 | * | 4/2005 | Kiguchi et al. ............... 347/102 |

FOREIGN PATENT DOCUMENTS

| JP | A-61-121401 | 6/1986 |
| JP | A-1-143288 | 6/1989 |
| JP | 03-184890 | * 8/1991 |
| JP | A-7-326845 | 12/1995 |
| JP | A-9-320363 | 12/1997 |
| JP | A-10-283917 | 10/1998 |
| JP | A-11-204529 | 7/1999 |

(Continued)

Primary Examiner—Brian K. Talbot
(74) Attorney, Agent, or Firm—Oliff & Berridge, PLC

(57) ABSTRACT

The invention provides a method for forming a uniform conductive-film interconnecting pattern via simplified processes. In particular, the invention provides: a method for forming an interconnecting pattern having at least one corner and which does not cause irregularities at the corner, an interconnecting pattern formed according to the method, and an electronic apparatus and a non-contact type card medium including the interconnecting pattern. The method includes forming a line pattern having at least one corner defined by at least two lines by applying a liquid containing a pattern material to a substrate. The liquid is applied by ink jet printing such that the corner has at least one additional protrusion other than the two lines, and is then fired to transform into a conductive-film interconnecting pattern.

11 Claims, 14 Drawing Sheets

FOREIGN PATENT DOCUMENTS

| | | |
|---|---|---|
| JP | A-11-508326 | 7/1999 |
| JP | 11-274671 * | 10/1999 |
| JP | A 11-274671 | 10/1999 |
| JP | A-11-330666 | 11/1999 |
| JP | 2003-318514 * | 7/2003 |

* cited by examiner (a)

(b)

(c)

METHOD FOR FORMING A LINE PATTERN, LINE PATTERN, AND ELECTRO-OPTIC DEVICE

BACKGROUND OF THE INVENTION

1. Field of Invention

The present invention relates to methods for forming a line pattern. The invention particularly relates to a method for forming a desired line pattern on a substrate using a liquid application apparatus, such as an ink jet printing apparatus.

2. Description of Related Art

Circuit devices, such as semiconductor devices, are fabricated by forming patterns, particularly a circuit pattern and an interconnecting pattern, on a substrate formed of silicon, glass, PET (polyethylene terephthalate), or the like. In order to fabricate these devices, the related art uses photolithography, for example. In the processes of photolithography, a photosensitive material, referred to as a resist, is applied to a film, particularly to a conductive film, on a substrate. The resist is subjected to exposure and development, and then etched along the remaining resist to form a pattern, particularly a circuit pattern. Photolithography requires extensive equipment, such as a vacuum device and complicated processes. In addition, since the material use efficiency is as low as several percent, most of all of the materials are wasted and, thus, manufacturing cost increases.

On the other hand, U.S. Pat. No. 5,132,248 discloses a method in which a liquid containing dispersed particles is directly applied to a substrate by ink jet printing techniques and is subsequently subjected to heat treatment or laser radiation to transform into a conductive-film pattern. This method does not require photolithographic processes, thus making the device fabrication process considerably simple.

SUMMARY OF THE INVENTION

However, when a pattern image is drawn by applying the liquid by ink jet printing techniques, and particularly by discharging the liquid, many points must be noted in order to reliably form an accurate pattern. One of the problems of drawing a pattern image by applying, particularly by discharging, a liquid is that, as shown in FIG. 14, pools 72, 73, and 74 of the liquid with a large diameter referred to as bulges are formed in the middles of liquid lines 71a, 71b, 71c, and 71d at random due to the occurrence of various irregularities such as position errors at the discharge of the liquid and nonuniformity resulting from the discharge and contamination of the surface of the substrate. These bulges are likely to cause breaks in the line pattern and a short circuit. The breaks are caused by a shortage of the liquid in a line which results from bulges gathering the liquid (see the vicinity of the pool 74). The short circuit is caused by contact between adjacent lines and bulges which results from excessive growth of bulges (see the pool 74). These bulges 72, 73, and 74 can be prevented to some extent by enhancing the status of the substrate surface and varying the intervals of discharged drops. However, the bulges are liable to occur in the regions having irregularities described above, and are, hence, extremely liable to occur at corners of a liquid line pattern and an interconnecting pattern.

Accordingly, the present invention addresses or solves these problems, and provides a technique for reliably forming a line pattern having corners through few steps. The present invention also provides a pattern formed using the technique, and provides an electro-optic device having the pattern, electronic apparatus having the electro-optic device, and a non-contact type card medium having the pattern.

To this end, the present invention provides a method for forming a line pattern having at least one corner defined by at least two lines. The method includes: applying a liquid containing a pattern forming material to a substrate, such that the corner has at least one additional protrusion other than the two lines.

Preferably, the liquid is continuously discharged from an ink jet printing device or a dispenser tube, and particularly by ink jet printing. Preferably, the liquid contains conductive particles.

By forming a pattern according to the method described above, the occurrence of bulges at the corners can be reduced, and thus, broken wires and short circuits in the resulting line pattern can be reduced.

In the present invention, at least one protrusion described above is formed as an extension of at least one of the two lines defining the corner.

Thus, the occurrence of bulges at the corners can further be reduced, and thus, broken wires and short circuits in the resulting line pattern can further be reduced. Also, such a pattern advantageously makes it possible to dispose lines most closely in a small area.

Further, the present invention is a method of forming the above-described line pattern, where the above-described at least one protrusion is formed as extensions of each of the at least two lines defining the corner.

By extending each line to form a protrusion, the occurrence of bulges at the corners can further be reduced in comparison with when only either line is extended, and thus broken wires and short circuits can further be reduced. This is probably because two protrusions draw the liquid at a corner, consequently further contributing to the reduction or prevention of bulges. Also, such a pattern advantageously makes it possible to dispose line patterns closely in a small area.

Preferably, the length of the protrusion is at least half the width of the lines, and more preferably two thirds or more of the line width.

Unless the protrusions have more than a certain length, the protrusion cannot sufficiently serve to reduce the occurrence of bulges. It is considered that the protrusion serves to reduce or prevent the liquid from gathering to the corners by drawing it and, thus, from forming bulges. In order for the protrusion to fulfill these functions, it is preferable that the protrusion have the above-described length. Thus, broken wires and short circuits in the resulting line pattern can be reduced.

The present invention provides a method for forming a line pattern having at least one corner by applying a liquid containing a pattern forming material to a substrate. The method includes: applying the liquid to deposit a line; subjecting the applied liquid to heat treatment to form a pattern; and depositing the other line from a starting point outside the previously formed line. The corner may have at least one additional protrusion other than the two lines defining the corner. The protrusion will contribute to suppress the formation of bulges when the other line is formed.

Preferably, the liquid is applied by discharge, and particularly by ink jet printing. When the pattern forming material is conductive particles, "to form a pattern" means that the conductive particles are transformed into a conductive film.

Bulges are liable to occur at a starting point of line deposition, particularly by discharge. Accordingly, by depositing the liquid from a starting point outside of the previously formed line, which has been transformed into a conductive film by heat treatment, the occurrence of bulges at the corners can be reduced. When one line is formed by deposition and subsequently by heat treatment before depositing the other line to form a corner, the line which has already been subjected to heat treatment does not contain liquid substances and, hence, does not contain the most major factor in the formation of bulges. Therefore, this method can further reduce the occurrence of bulges in comparison with when at least two lines are simultaneously deposited. Also, since one line has already been completed, it does not disperse again when the other line is deposited. Thus, broken wires and short circuits in the resulting line pattern can be reduced.

Furthermore, the present invention provides a method for forming a line pattern having at least one corner by applying a liquid containing a pattern forming material to a substrate. The method includes: applying the liquid to deposit a line; drying the applied liquid by heat treatment; and depositing the other line from a starting point outside the previously formed line.

The corner may have at least one additional protrusion other than the two lines defining the corner. The protrusion will contribute to suppress the formation of bulges when the other line is formed.

The drying temperature is lower than the temperature at which the lines are completely transformed into a conductive film. In this case, therefore, energy consumption can be reduced in comparison with when the lines containing the conductive particles are completely transformed into a conductive film to form a pattern.

As described above, bulges are liable to occur at a starting point of line deposition, particularly by discharge. Accordingly, by depositing the liquid from a starting point outside of the previously formed line dried by heat treatment, the occurrence of bulges at the corners can be reduced. When one line is deposited and subsequently dried by heat treatment before depositing the other line to form a corner, the line which has already been dried by the heat treatment does not contain liquid substances and, hence, does not contain the most major factor in the formation of bulges. Therefore, this method can further reduce the occurrence of bulges in comparison with when at least two lines defining a corner are simultaneously deposited. Thus, broken wires and short circuits in the resulting line pattern can be reduced.

Furthermore, the present invention is directed to a line pattern having at least one corner, formed by applying a liquid containing a pattern forming material to a substrate. The line pattern includes at least one additional protrusion other than the two lines defining the corner.

Since the method for forming the line pattern reduces the occurrence of bulges at the corners, as described above, the resulting line pattern has few breaks and short circuits.

Further, the present invention is a line pattern, where the above-described protrusion is formed as an extension of at least one line of the two conductive lines defining the corner.

Since the method for forming the line pattern further reduces the occurrence of bulges at the corners, as described above, the resulting line pattern has few breaks and short circuits.

In the present invention, the above-described at least one protrusion is formed as extensions of each of the two lines defining the corner.

The method for forming the line pattern reduces the occurrence of bulges at the corners, as described above, and the resulting line pattern has few breaks and short circuits in comparison with when only one line is extended.

In the line pattern of the present invention, the length of the above-described at least one protrusion is at least half the width of the lines.

Since such a length of the protrusion contributes the reduction of the occurrence of bulges at the corners because of the manufacturing method, the resulting line pattern has few breaks and short circuits.

Furthermore, the present invention provides a line pattern having at least one corner, formed by applying a liquid containing a pattern forming material to a substrate. The two lines defining the corner are formed by: applying the liquid to deposit a line; subjecting the applied liquid to heat treatment to form a pattern; and depositing the other line by applying the liquid and subjecting the applied liquid to heat treatment.

Preferably, the liquid is applied by discharge, and particularly by ink jet printing. When the pattern material is conductive particles, "to form a pattern" means that the conductive particles are transformed into a conductive film.

Since the method for forming the line pattern reduces the occurrence of bulges at the corners, as described above, the resulting line pattern has few breaks and short circuits.

Furthermore, the present invention provides a line pattern having at least one corner defined by at least two lines, formed by applying a liquid containing a pattern material to a substrate. The two lines defining the corner are formed by: applying the liquid to deposit a line; drying the line by heat treatment; and depositing the other line by applying the liquid and subjecting the applied liquid to heat treatment.

Since the method for forming the line pattern reduces the occurrence of bulges at the corners, as described above, the resulting line pattern has few breaks and short circuits.

The pattern material may include organic or inorganic conductive particles, a resist, an acrylic resin acting as a linear insulating material, a silane compound, such as trisilane, pentasilane, cyclotrisilane, and 1, 1'-bis-cyclobutasilane, and a metal complex. These materials may be dispersed or dissolved in a liquid.

The present invention also provides an electro-optic device having any one of line patterns described above.

Since the electro-optic device is manufactured using a line pattern having few broken wires and short circuits, deficiencies hardly occur in the manufacturing processes. Also, since the resulting product includes the line pattern having few bulges and thus having a uniform width, broken wires and short circuits hardly occur in the electro-optic device.

The present invention also provides an electronic apparatus having the electro-optic device.

Since the electronic apparatus includes the electro-optic device described above, deficiencies hardly occur in the manufacturing processes. Also, since the resulting product includes the line pattern having few bulges and thus having a uniform width, broken wires and short circuits hardly occur in the electronic apparatus.

The present invention also provides a non-contact type card medium having any one of line patterns described above to serve as an antenna circuit.

Since the non-contact type card medium is manufactured using a line pattern having few broken wires and short circuits to serve as an antenna circuit, deficiencies hardly occur in the manufacturing processes. Also, since the resulting product includes the line pattern having few bulges and thus having a uniform width as an antenna circuit, broken wires and short circuits hardly occur as an antenna circuit in the non-contact type card medium.

BRIEF DESCRIPTION OF THE DRAWINGS

FIG. 10(a) is a perspective view of a cellular phone having a liquid crystal device, according to the fourth embodiment; FIG. 10(b) is a perspective view of portable information processing equipment having a liquid crystal device, according to the fourth embodiment; and FIG. 10(c) is a perspective view of a wristwatch-type electronic apparatus having a liquid crystal device, according to the fourth embodiment;

DETAILED DESCRIPTION OF PREFERRED EMBODIMENTS

Exemplary embodiments of the present invention are described below.

First Embodiment

Figure 1:
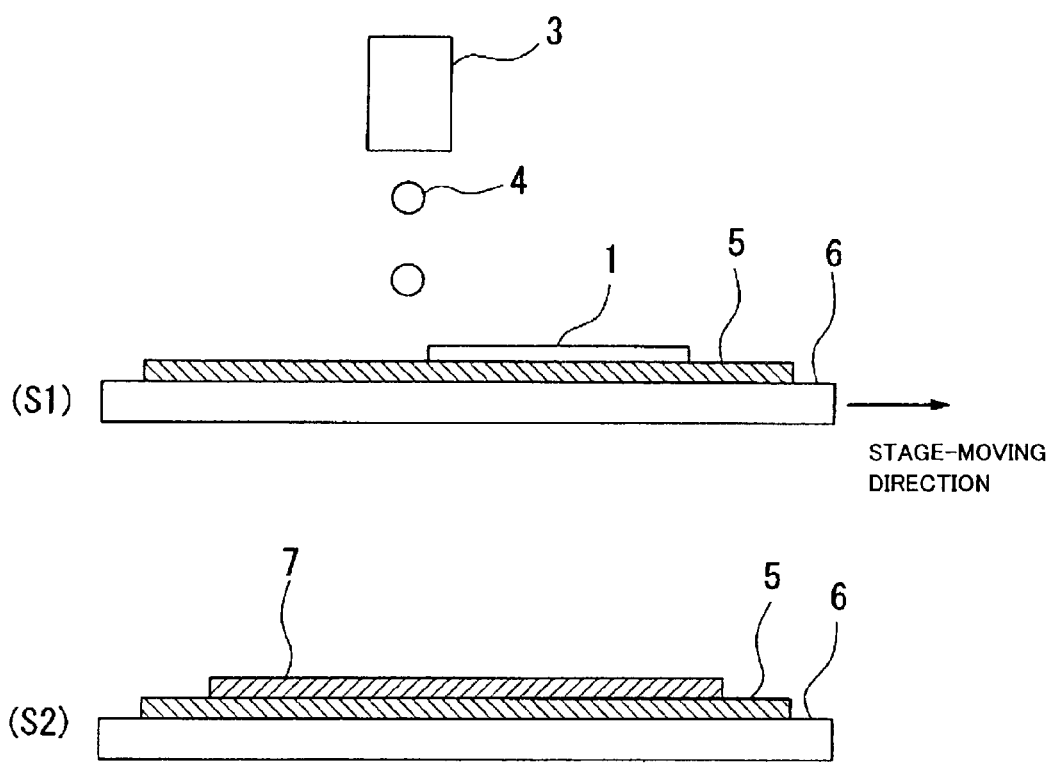
FIG. 1 is a schematic of a process for forming a line pattern according to an embodiment of the present invention.

A method for forming a line pattern according to a first embodiment is described below with reference to drawings. FIG. 1 is a schematic of a process for forming a conductive-film interconnecting pattern by ink jet printing.

As shown in FIG. 1 (S1), a substrate 5 on which a conductive-film interconnecting pattern 7 will be formed is placed on a stage 6. Next, while the stage 6 is being shifted in one direction, a liquid 4 containing conductive particles is discharged from an ink jet head 3 to deposit a line 1. The ink jet head 3 shifts at a given pitch, every reciprocating motion of the stage 6, in the direction perpendicular to the shifting direction of the stage and draws a pattern image, thus making it possible to form a pattern in large area. The distances between ink drops deposited on the substrate can be controlled by adjusting the discharge frequency of the ink jet printing and the relative velocity between the ink jet head and the stage.

Figure 2:
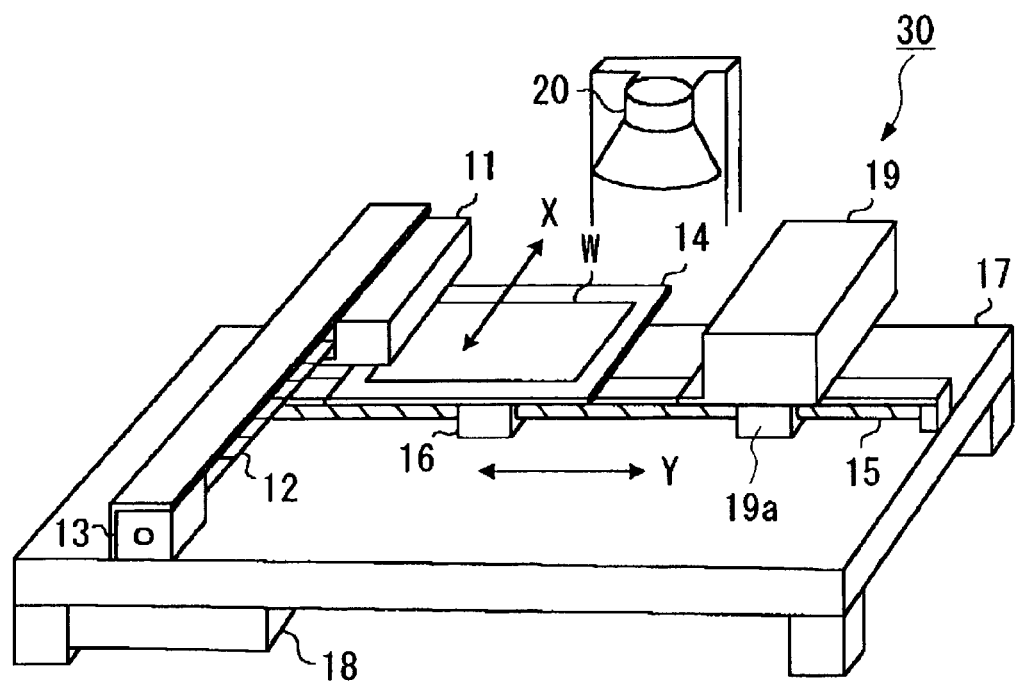
FIG. 2 is a schematic of an apparatus for forming a line pattern according to an embodiment of the present invention.

FIG. 2 is a general perspective view of an interconnection forming apparatus for forming an interconnecting pattern by the above-described ink jet printing. As shown in FIG. 2, an interconnection apparatus 30 includes an ink jet head unit 11, an X-direction guide 12 for helping the ink jet unit 11 shift in the X direction, and an X-direction driving motor 13 to rotate the X-direction guide 12.

The interconnection forming apparatus 30 also includes a loading bench 14 to place on which a substrate W is placed, a Y-direction guide 15 to help the loading bench 14 shift in the Y direction, and a Y-direction driving motor 16 to rotate the Y-direction guide 15.

In addition, a base 17 is disposed to fix the x-direction guide 12 and the Y-direction guide 15 at predetermined positions, and a controlling device 18 is disposed under the base 17.

Furthermore, the interconnection forming apparatus 30 has a cleaning unit 19 and a heater 20.

The ink jet head unit 11 has a plurality of ink jet heads to discharge a disperse liquid containing conductive particles from a nozzle (discharging hole) onto the substrate at predetermined intervals. These ink jet heads each discharge the disperse liquid according to a discharge voltage applied from the controlling device 18.

The ink jet head unit 11 is fixed to the X-direction guide 12, and the X-direction guide 12 is connected to the X-direction driving motor 13. The X-direction driving motor 13 is a stepping motor or the like, and rotates the X-direction guide 12 when the controlling device 18 applies a pulse signal for X direction driving. By rotating the X-direction guide 12, the ink jet head unit 11 can be shifted in the X direction with respect to the base 17.

The loading bench 14, which is used when the interconnection forming apparatus 30 applies the disperse liquid to the substrate W, has a structure to fix the substrate W to a reference position.

The loading bench 14 is connected to the Y-direction guide 15, and the Y-direction guide 15 is connected to the Y-direction driving motor 16. The Y-direction driving motor 16 is a stepping motor or the like, and rotates the Y-direction guide 15 when the controlling device 18 applies a pulse signal for Y direction driving. By rotating the Y-direction guide 15, the loading bench 14 can be shifted in the Y direction with respect to the base 17.

The cleaning unit 19 has a structure to clean the ink jet head unit 11. The cleaning unit 19 has a Y-direction driving motor 19a to move the cleaning unit 19, separate from the loading bench 14, along the Y-direction guide 15. The movement of the cleaning unit 19 is also controlled by the controlling device 18.

The heater 20 is used to heat-treat the substrate W to lamp-anneal it, thereby drying the liquid deposited on the substrate and transforming it into a conductive film. The switching of the heater 20 is also controlled by the controlling device 18.

In order for the interconnection forming apparatus 30 to discharge the disperse liquid to the region where the interconnecting pattern will be formed, the controlling device 18 supplies predetermined driving pulse signals to the X-direction driving motor 13 and/or the Y-direction driving motor 16 to shift the ink jet head unit 11 and/or the loading bench 14, respectively, thus relatively displacing the ink jet head unit 11 and the substrate W (the loading bench 14). The controlling device 18 applies a discharge voltage to a specific ink jet head of the ink jet head unit 11 so that the ink jet head discharges the disperse liquid, during this relative displacement.

In the interconnection forming apparatus 30, the amount of the liquid discharged from each ink jet head of the ink jet head unit 11 is set by adjusting the discharge voltage applied from the controlling device 18.

The intervals between drops of the liquid deposited on the substrate W is set by adjusting the velocity of the relative displacement between the ink jet head unit 11 and the substrate W (the loading bench 14) and the frequency (frequency of the discharge voltage) when the ink jet head unit 11 discharges the liquid.

The substrate 5 needs to resist a temperature as low as about 300° C., and various materials including a silicon wafer, quartz glass, glass, a polyimide film, and a metal plate are used as the substrate 5. The substrate 5 may be provided, on the surface thereof, with an underlayer, such as a semiconductor layer, a metal layer, a dielectric layer, or an organic layer. The shape, width, and thickness of the lines formed by ink-jet discharge significantly depend on the affinity and repellency of the substrate with the liquid. In order to form uniform lines without bulges or the like, preferably, the substrate has an affinity with the liquid as much as possible. In this instance, however, the liquid drops are apt to spread on the substrate, and, therefore, it is difficult to form the lines to a large thickness at a small width. Conversely, if the substrate has an excessively large repellency, the liquid can easily move on the substrate and, thus, the occurrence of bulges (pools) increases. Considering the above, preferably, the substrate has a repellency which allows the liquid to be deposited on the substrate at a contact angle of 30° to 60°.

Preferably, treatments for the repellency and the affinity of the surface of the substrate are performed by UV radiation, plasma polymerization, Teflon (registered trademark) treatment, deposition of an organic film, or the like. The organic film has a functional group capable of bonding to the substrate, another functional group opposite the former functional group and which is capable of modifying the characteristics of the surface of the substrate, such as lyophobic group or a lyophilic group, and a straight-or branched-carbon chain or a carbon ring connecting these functional groups. Thus, the organic film bonds to the substrate to self-organize a molecular film, such as a monomolecular film. Preferably, the organic film is, for example, a silane coupler.

The conductive particles contained in the liquid may be metal particles containing any one selected from the group including: gold, silver, copper, palladium, and nickel, or other particles formed of a conductive polymer or a superconductor. In the present invention, these particles are dispersed in a liquid disperse medium to prepare the disperse liquid (often referred to as just the "liquid" in this application). The surfaces of the particles may be coated with an organic substance in order to help the particles disperse. In order to facilitate the deposition of the liquid on the substrate, the particle size is preferably in the range of 5 nm to 0.1 μm, from the viewpoint of dispersibility of the particles and applicability of ink jet printing.

The particles are dispersed in a liquid disperse medium to prepare the disperse liquid. The liquid disperse medium preferably has a vapor pressure in the range of 0.001 mmHg (0.13 Pa) to 200 mmHg (0.27 MPa) at room temperature. If the vapor pressure is higher than 200 mmHg (0.27 MPa), the liquid disperse medium vaporizes before the formation of a film and, thus, it is difficult to form satisfactory films. In contrast, if the vapor pressure is lower than 0.001 mmHg (0.13 Pa), it will take a long time to dry the liquid disperse medium and, thus, the liquid disperse medium is liable to remain in the film. Such a vapor pressure makes it difficult to obtain a satisfactory conductive film after heat or optical treatment performed in a back end process. When the deposition of the liquid is performed with an ink jet printing apparatus described later, the vapor pressure of the liquid disperse medium is preferably in the range of 0.001 mm Hg (0.13 Pa) to 50 mmHg (6.7 kPa). If the vapor pressure is higher than 50 mmHg (6.7 kPa), the liquid is liable to clog the nozzle of the ink jet printing apparatus due to drying when the liquid is discharged and, thus, it is difficult to discharge the liquid stably. In contrast, if the vapor pressure is lower than 0.001 mmHg (0.13 Pa), it will take a long time to dry the ink discharged, and, thus, the liquid disperse medium is liable to remain in the resulting conductive film. Such a low vapor pressure makes it difficult to obtain a satisfactory conductive film even after heat treatment, which is a back end process.

The liquid disperse medium is not particularly limited, as long as the particles can disperse and do not aggregate in the medium. Exemplary liquid disperse media include: water; alcohols, such as methanol, ethanol, propanol, and butanol; hydrocarbons, such as n-heptane, n-octane, decane, toluene, xylene, cymene, durene, indene, dipentene, tetrahydronaphthalene, decahydronaphthalene, and cyclohexylbenzene; ethers, such as ethylene glycol dimethyl ether, ethylene glycol diethyl ether, ethylene glycol methyl ethyl ether, diethylene glycol methyl ethyl ether, 1,2-dimethoxyethane, bis(2-methoxyethyl) ether, and p-dioxane; and polar substances, such as propylene carbonate, γ-butyrolactone, N-methyl-2-pyrrolidone, dimethylformamide, dimethyl sulfoxide, and cyclohexane. The liquid disperse medium is preferably water, an alcohol, a hydrocarbon, or an ether out of the above-described media, and more preferably water or a hydrocarbon, from the viewpoint of the dispersibility of the particles, the stability of the disperse liquid, and applicability to ink jet printing. These liquid disperse media may be used independently, or more than one medium may be combined.

When the particles are dispersed in the liquid disperse medium, the solute content is in the range of 1 to 80 percent by mass, and may be adjusted according to a desired thickness of the conductive film. A content higher than 80 percent by weight is liable to cause the particles to aggregate, consequently making it difficult to form a uniform film.

The liquid in which the particles are dispersed may contain a small amount of a fluorine, silicone, or nonionic agent or the like for adjusting the surface tension, as required, within the range of not deteriorating the formation as objective. Nonionic surface-tension-adjusting agents contributes to increasing the wettability of the liquid so as to deposit the liquid on, to enhance the leveling characteristics of a deposited film, and to reduce or prevent the occurrence of granulation and orange peel on the film surface.

Preferably, the viscosity of the disperse liquid is in the range of 1 to 50 mPa·s. When the liquid is applied with an ink jet printing apparatus, a viscosity of less than 1 mPa·s often causes contamination in the vicinity of the nozzle due to ink leakage. Also, a viscosity of more than 50 mPa·s is liable to cause clogging in the hole of the nozzle, thus making it difficult to smoothly discharge the liquid.

In addition, the surface tension of the disperse liquid is preferably in the range of 0.02 to 0.07 N/m. When the liquid is applied with an ink jet printing apparatus, a surface tension of less than 0.02 N/m increases the wettability of an ink composition with the surface of the nozzle, and consequently the ink composition is liable to be discharged in the wrong direction. Also, a surface tension of more than 0.07 N/m results in varied shapes of the meniscus at the end of the nozzle, consequently making it difficult to control the discharge amount and timing of the ink composition.

The liquid 4 described above is discharged by ink jet printing. When a pattern is formed by ink jet printing, a plurality of lines 1 may simultaneously be formed for every reciprocation of the stage by discharging ink from a plurality of nozzles of the ink jet head. In this instance, non-parallel straight lines or curved lines of the pattern can also be formed by several reciprocations of the stage in a predetermined direction. Alternatively, lines may be formed one by one such that a single line is formed during one reciprocation of the stage by using only one nozzle of the ink jet head. In this instance, if the pattern has lines extending in a plurality of directions, lines having a certain direction are firstly formed, and then, the substrate is reset on the stage and other lines having another direction are formed.

Figure 3:
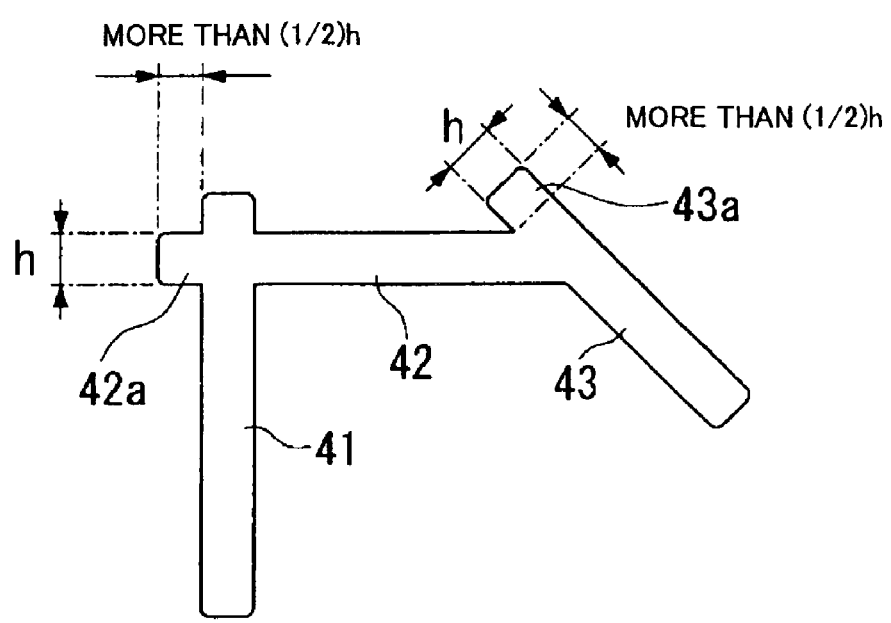
FIG. 3 is a schematic plan view of part of a line pattern according to an embodiment of the present invention.
Figure 4:
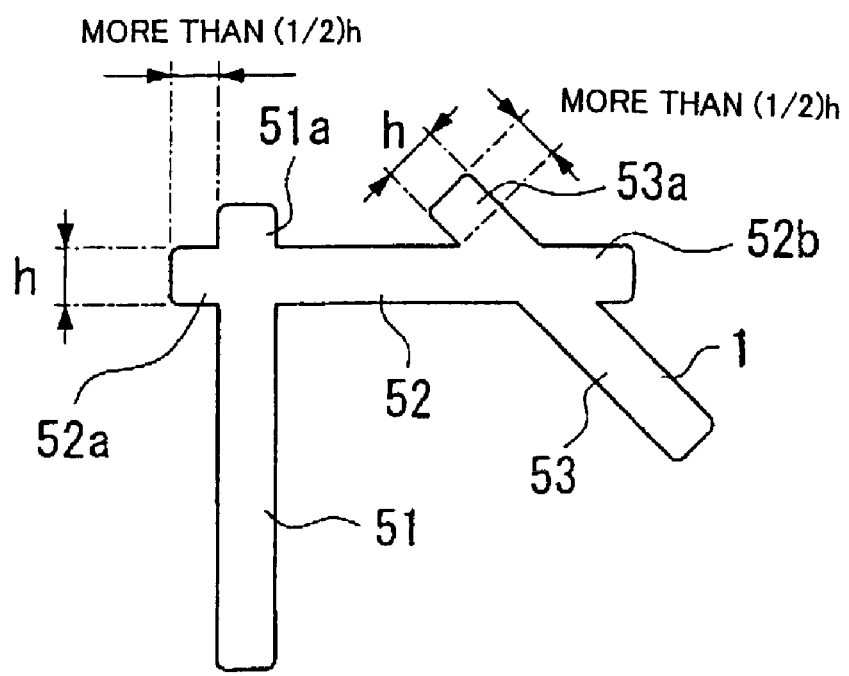
FIG. 4 is a schematic plan view of part of another line pattern according to an embodiment of the present invention.

When a pattern having at least one corner defined by at least two lines is formed according to the method described above, preferably, at least one additional protrusion is formed so as to extend from the corner. This protrusion can reduce or prevent the occurrence of bulges at the corner. In this instance, the protrusion is preferably formed as an extension of at least one of the two lines, from the viewpoint of miniaturizing circuits and effectively reducing bulges. FIG. 3 shows a pattern in which one of two lines is extended to form a protrusion. In FIG. 3, reference numerals 41, 42, and 43 each designate a line, and reference numerals 42a and 43a designate protrusions of the lines 42 and 43, respectively. As should be appreciated, when the lines 41 and 42 intersect, the lines 41 and 42 form four angles at which the lines 41 and 42 contact each other. When the lines 42 and 43 intersect, the lines 42 and 43 contact each other to form three angles at which the lines 42 and 43 contact each other. In addition, by forming a pattern in which two lines are extended from a corner to form protrusions, as shown in FIG. 4, the occurrence of bulges can further be reduced in comparison with when only one line is extended. In FIG. 4, reference numerals 51, 52, and 53 each designate a line, and reference numerals 51a, 52a, and 53a designate protrusions of the lines 51, 52, and 53, respectively.

Figure 5:
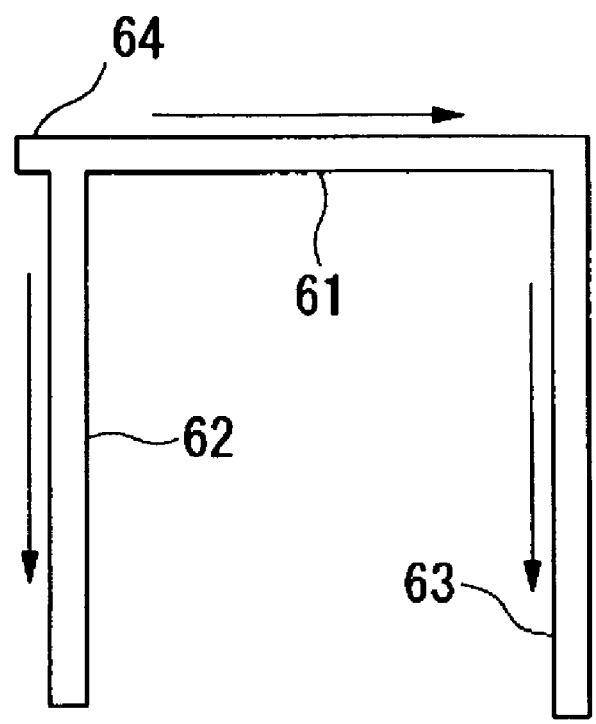
FIG. 5 is a schematic plan view of part of another line pattern according to an embodiment of the present invention.

If, for example, a single nozzle is used to form a pattern, preferably, one of two lines defining a corner is deposited, followed by being dried or transformed into a conductive film by heat treatment described below, and then, the other line is formed by depositing the liquid on a starting point outside the former line. This can further reduce or prevent the occurrence of bulges at the corner. To deposit the liquid on a starting point outside a previously formed line to form the other line means that, as shown in FIG. 5, a line 61 is formed by starting the deposition of the liquid at a point 64 outside the previously formed lines 62 and 63, and that the end point of the line 61 may overlap with a previously formed line (the line 63 in the drawing). In FIG. 5, the lines 62, 63, and 61 are formed in that order. The arrows indicate directions for forming the lines.

Since one line does not substantially contain the liquid disperse medium when formed by drying the liquid containing the conductive particles by heat treatment after the liquid has been discharged by ink jet printing, bulges are not easily formed when a corner is formed by starting the deposition of the liquid at a point outside the dried line and, subsequently, extending the liquid line to meet the dried line.

However, the lines formed in this method may not exhibit sufficient conductivity. This is probably because the surfaces of the conductive particles of dried lines are covered with a film of the disperse medium. By allowing the heat treatment to further progress, the electrical contact between the particles is enhanced. This is probably because the film of the disperse medium has been removed.

The protrusion 64 preferably has a length of at least one half the line width (h), as shown in FIGS. 3 and 4, and more preferably of two thirds the line width or more.

The substrate 5 where the disperse liquid 4 of particles has been applied in a predetermined pattern, as shown in FIG. 1, is subjected to drying of the liquid and subsequently to heat treatment in order to improve the electrical contact between the particles. This heat treatment is generally performed in the air, but it may be performed in an atmosphere of an inert gas, such as nitrogen, argon, or helium, if necessary. The temperature of the heat treatment may be set according to the boiling point (vapor pressure) and pressure of the liquid disperse medium and the thermal behavior of the particles, and is not particularly limited. However, preferably, it is between room temperature (about 20° C.) and 300° C. If the substrate is formed of a plastic, a temperature between room temperature and 100° C. is preferable. Such temperature helps the electrical contact between the particles to be enhanced as well as facilitating drying.

The heat treatment may be performed by using a hot plate or an electric furnace, or by lamp-annealing. The light source used for the lamp-annealing is not particularly limited, but it may be an infrared lamp, a xenon lamp, a YAG laser, an argon laser, a carbon dioxide laser, or an excimer laser such as XeF, XeCl, XeBr, KrF, KrCl, ArF, or ArCl. The power of the light source is generally in the range of 10 to 5000 W, but, in the present invention, a power in the range of 100 to 1000 W will suffice.

Thus, the conductive-film interconnecting pattern 7 is completed, as shown in FIG. 1 (S2).

Second Embodiment

Figure 7:
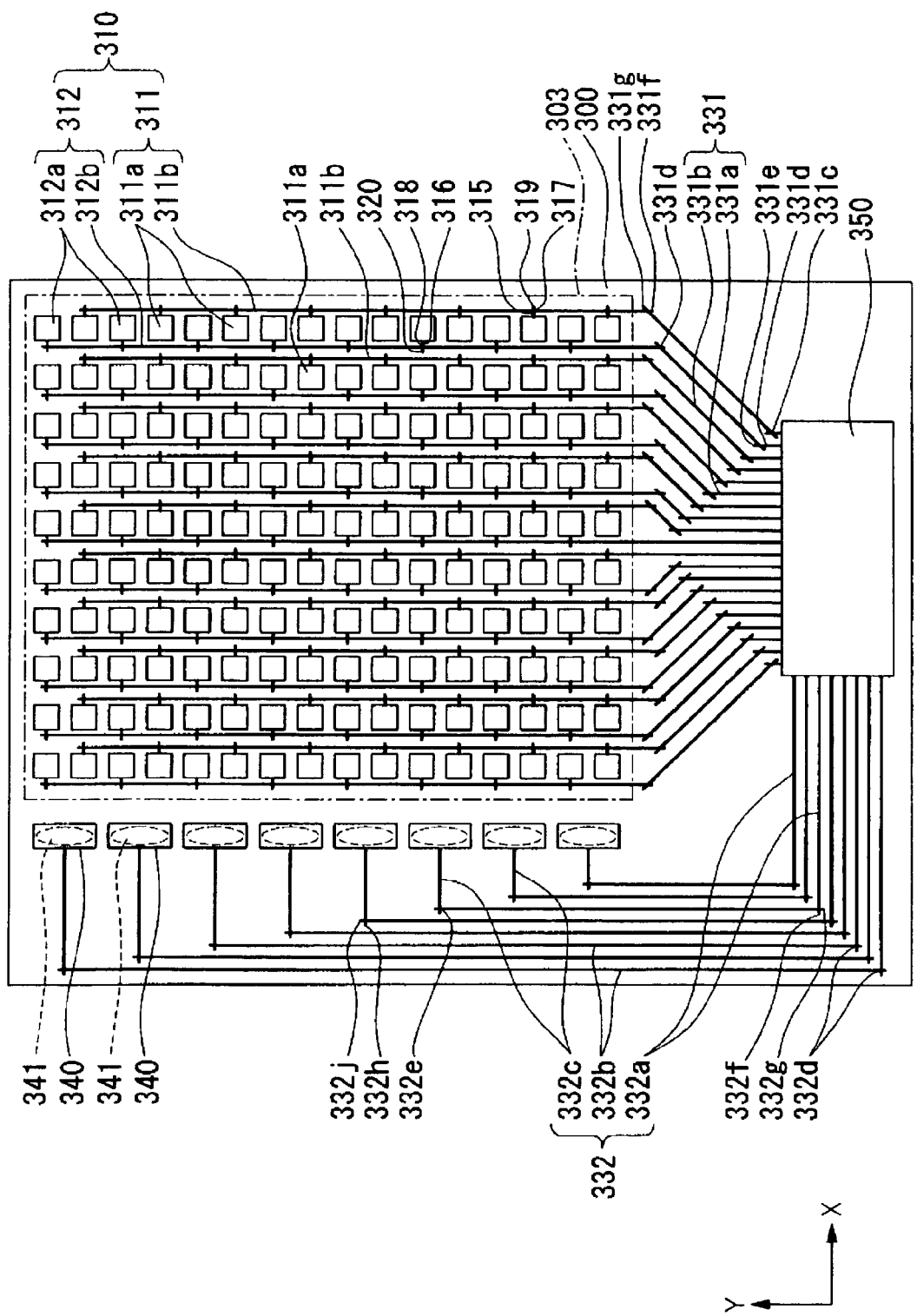
FIG. 7 is a schematic plan view of a first substrate of a liquid crystal device according to the second embodiment of the present invention.
Figure 8:
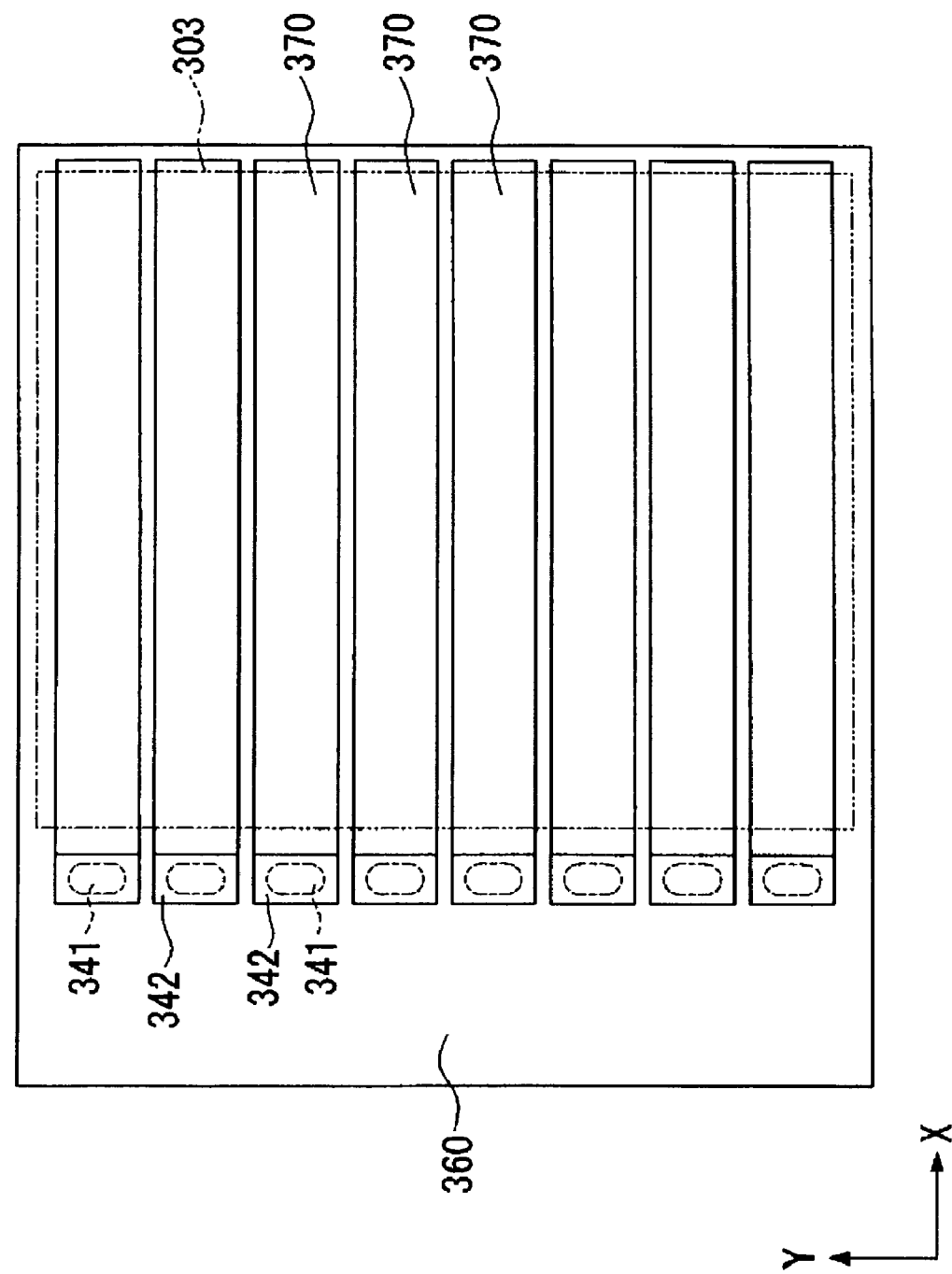
FIG. 8 is a schematic plan view of a second substrate of the liquid crystal device according to the second embodiment of the present invention.

As for a second embodiment, an exemplary liquid crystal device of the present invention is described below. FIG. 7 shows an arrangement in plan view of signal electrodes 310 on a first substrate 300 of a liquid crystal device of the present invention. The liquid crystal device includes the first substrate 300; a second substrate 360, shown in FIG. 8, having scanning electrodes 370 and the like; and liquid crystal 361 sealed between the first and second substrates, shown in FIG. 6 which is a schematic sectional view of the liquid crystal device.

Figure 6:
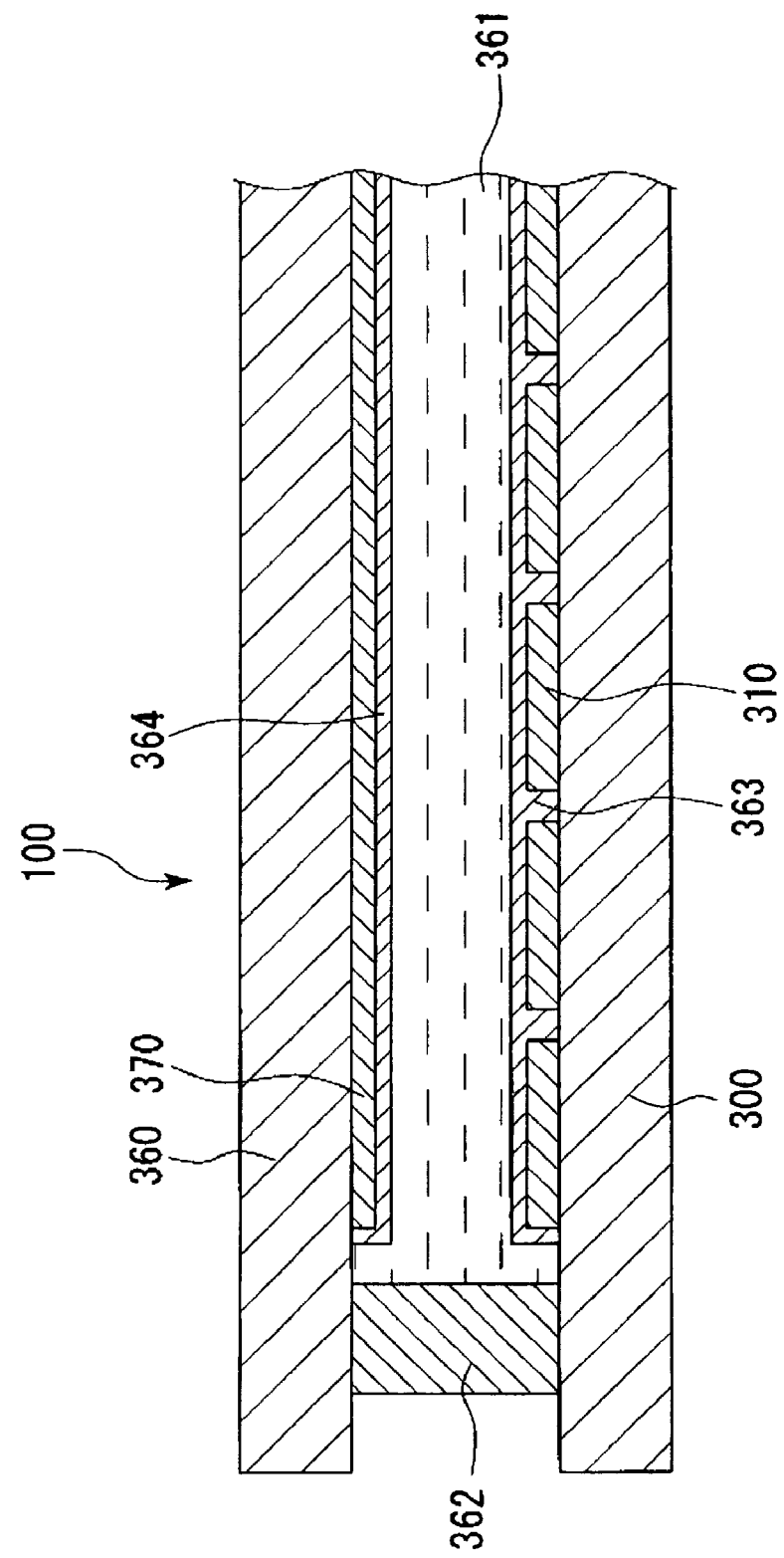
FIG. 6 is a schematic sectional view of a liquid crystal device according to a second embodiment of the present invention.

In the liquid crystal device 100 shown in FIG. 6, the lower substrate (first substrate) 300 and the upper substrate (second substrate) 360 are bonded with a sealant 362 having a predetermined thickness disposed at the sides thereof and therebetween, so that the liquid crystal 361 is held between the lower substrate 300 and the upper substrate 360.

The lower substrate 300 is provided, on the surface of the liquid crystal 361 side thereof, with the signal electrodes 310 shown in FIG. 7 and an alignment layer 363 in that order. The upper substrate 360 is also provided, on the surface of the liquid crystal 361 side thereof, with a plurality of transparent electrodes 370 disposed in a stripe manner and a plurality of alignment layers 364 in that order. The transparent electrodes 370 and the signal electrodes 310 intersect with each other.

As shown in FIG. 7, a pixel region 303 on the first substrate 300 has the plurality of signal electrodes 310. The signal electrodes 310 are composed of first signal electrodes 311 and second signal electrodes 312, and are disposed in a multiple matrix.

In particular, the first signal electrodes 311 and the second signal electrodes 312 include a plurality of pixel electrode portions 311a and 312a arrayed in a matrix, respectively, and signal wires 311b and 312b extending in the Y direction to connect the respective pixel electrode portions 311a and 312a in a multiple matrix.

Reference numeral 350 designates a liquid crystal driving circuit having a one-chip structure. This liquid crystal driving circuit 350 is connected to one end (lower side of FIG. 7) of each of the signal wires 311b and 312b with first leads 331.

Reference numeral 340 designates vertical conduction terminals disposed in single file alongside the pixel region 303. The vertical conduction terminals 340 are connected to terminals 342 disposed on the second substrate 360, shown in FIG. 8, with vertical conductors 341. The vertical conduction terminals 340 are also connected to the liquid crystal driving circuit 350 with second leads 332.

In the present invention, the first leads 331 and the second leads 332 are provided on the first substrate 300 by the method for forming a line forming pattern according to the first embodiment.

Specifically, the first leads 331 are each formed of a straight line 331a led out from the liquid crystal driving circuit 350 and another straight line 331b intersecting the straight line 331a at an angle of 45°. The straight lines 331a and 331b are connected with each other at a contact point 331c, and have protrusions 331d and 331e.

The second leads 332 are each formed of a straight line 332a led out from the liquid crystal driving circuit 350, another straight line 332b intersecting the straight line 332a at an angle of 90°, and another straight line 332c intersecting the straight line 332b at an angle of 90°. The straight lines 332a and 332b are connected with each other at a contact point 332d, and have protrusions 332f and 332g extending from this point. The straight lines 332b and 332c are connected with each other at a contact point 332e, and have protrusions 332h and 332j extending from each point. Thus, the first and second leads can be formed with an extremely small number of bulges, no breaks, and no short circuits. Since the first and second leads do not substantially have irregular widths resulting from the bulges, breaks and short circuits hardly occur.

The first signal electrodes 311 and the second signal electrodes 312 are arrayed in a multiple matrix, as shown in FIG. 7, so that two different signals can be transmitted using a single line of the signal electrodes aligned in the Y direction. Thus, operation signals from operation electrodes 370 (FIG. 8) can each correspond to two pixels, advantageously.

Furthermore, in the present embodiment, the pixel electrode portions 311a and 312a are connected to the respective signal wires 311b and 312b with other wires 315 and 316 led out from the pixel electrode portions 311a and 312a. The signal wires 311b and 312b and the wires 315 and 316 are formed by the method according to the first embodiment. Their contacts 317 and 318 have protrusions 319 and 320, respectively, as shown in the drawing.

Thus, as in the first and second leads, the signal wires 311b and 312b and the wires 315 and 316 can be formed with an extremely small number of bulges, no breaks, and no short circuits. Since they have substantially uniform widths resulting from the bulges, breaks and short circuits hardly occur.

In this instance, by disposing the signal wires 311b of the pixel electrode portions 311a and the signal wires 312b of the pixel electrode portions 312a between a Y direction line of the pixel electrode portions and an adjacent Y direction line, the protrusions 319 and 320 can be alternately disposed on the left and the right, respectively, between the two Y-direction lines (staggered along the Y direction lines). Thus, the area (width) of wires can be reduced even though the protrusions 319 and 320 are formed, and consequently, each pixel area can be increased. In other words, the aperture ratio of the liquid crystal device can be increased.

Alternatively, the pixel electrode portions 311a and 312a and the signal wires 311b and 312b may be formed of, for example, ITO in one piece and, thus, the wires 315 and 316 are eliminated.

In the liquid crystal device 100 of the present embodiment, deficiencies, such as broken wires or short circuits, hardly occur even though wiring is carried out by ink jet printing.

Third Embodiment

Figure 9:
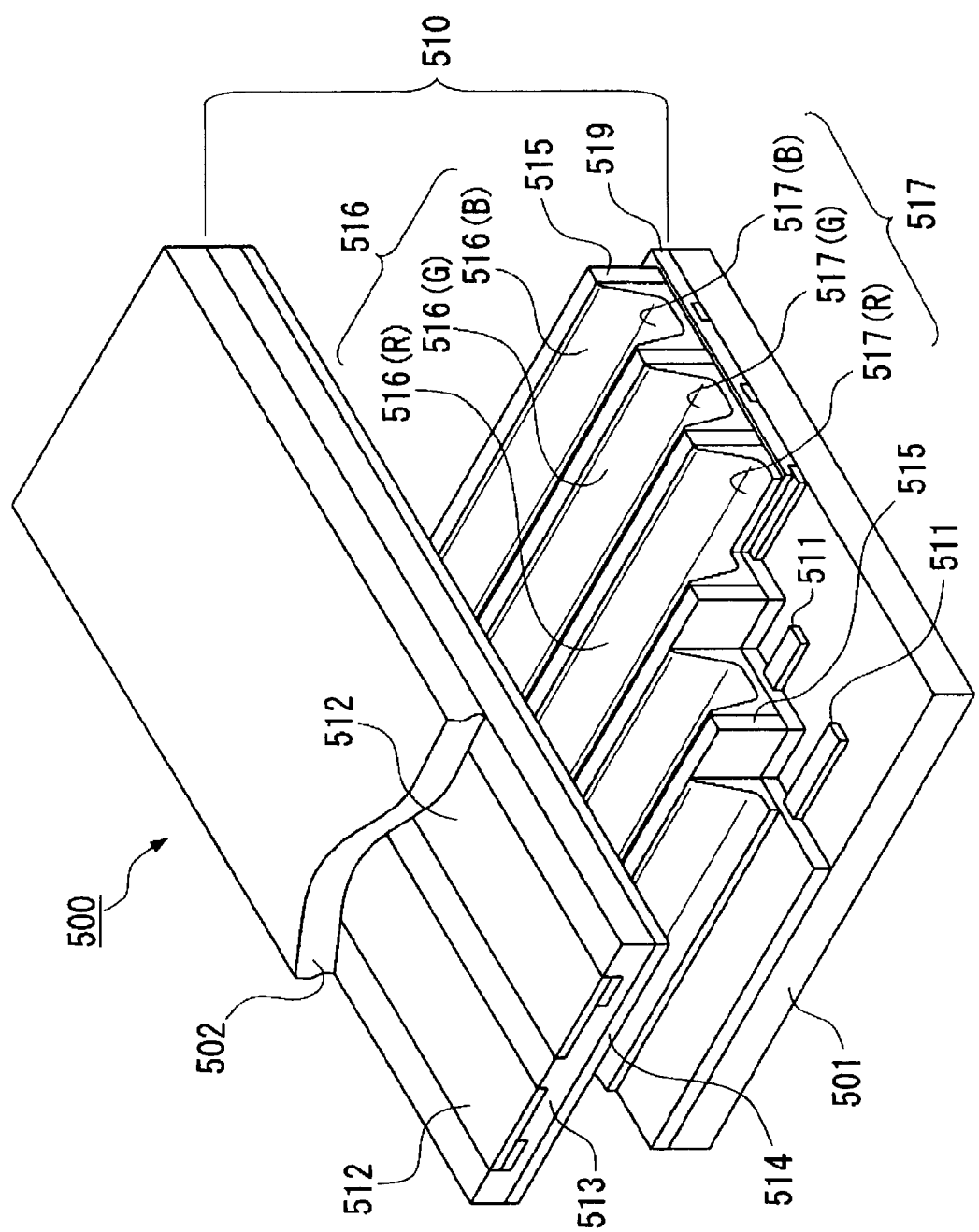
FIG. 9 is a fragmentary perspective view of a plasma display device according to a third embodiment of the present invention.

As for a third embodiment, an exemplary electro-optic plasma display device of the present invention is described below. FIG. 9 is an exploded perspective view of a plasma display device 500.

This plasma display device 500 includes glass substrates 501 and 502 opposing each other and a discharge region 510 to display images formed therebetween.

The discharge region 510 has a plurality of discharge spaces 516. A combination of a red discharge space 516(R), a green discharge space 516(G), and a blue discharge space 516(B) defines a pixel.

Address electrodes 511 are disposed on the surface of the glass substrate 501 at predetermined intervals in a striped manner. The address electrodes 511 and the substrate 501 are covered with a dielectric layer 519. In addition, barrier walls 515 are formed between and along the address electrodes 511 on the dielectric layer 519. The barrier walls 515 are also disposed in the direction perpendicular to the address electrodes 511 at predetermined intervals in the longitudinal direction thereof (not shown in FIG. 9). Some barrier walls 515 disposed at both sides in the width direction of the address electrodes 511 and the other barrier walls 515 disposed in the direction perpendicular to the address electrodes 511 define rectangular regions so as to correspond to the discharge spaces 516. A combination of three rectangular regions defines a pixel. In the rectangular regions partitioned by the barrier walls 515, fluorescent phosphors 517 are disposed. Each fluorescent phosphor 517 emits red, green, or blue fluorescence. The red discharge spaces 516(R) are provided with a red fluorescent phosphor 517(R) at the bottom thereof, the green discharge spaces 516(G) are provided with a green fluorescent phosphor 517(G) at the bottom thereof, and the blue discharge spaces 516(B) are provided with a blue fluorescent phosphor 517(B) at the bottom thereof.

On the other hand, the glass substrate 502 has a plurality of display electrodes 512 extending in the direction perpendicular to the address electrodes 511 in a striped manner at predetermined intervals. A dielectric layer 513 covers the display electrodes 512, and further a protecting layer 514 is formed of MgO or the like.

The glass substrates 501 and 502 are bonded together, such that the address electrodes 511 and the display electrodes 512 oppose and intersect each other. The space surrounded by the substrate 501, the barrier walls 515, and the protecting layer 514 formed at the glass substrate 502 side is evacuated and filled with an inert gas to form the discharge spaces 516.

The address electrodes 511 and the display electrodes 512 are connected to an alternator (not shown in FIG. 9). By energizing these electrodes to excite specific fluorescent phosphors 517 at desired positions in the discharge region 510, the fluorescent phosphors 517 emit light and, thus, a color image can be displayed.

In the present embodiment, the address electrodes 511 and the display electrodes 512 are connected to a driving circuit via leads disposed on the sidelines of the substrates 501 and 502, as in the liquid crystal device according to the second embodiment. The leads are formed by the method for forming a line pattern according to the first embodiment.

In the plasma display device 500 of the present embodiment, therefore, deficiencies, such as broken wires or short circuits, hardly occur. In addition, the resulting plasma display device 500 can be miniaturized and have a low profile.

Fourth Embodiment

As for a fourth embodiment, an exemplary electronic apparatus of the present invention is described below.

Figure 10:
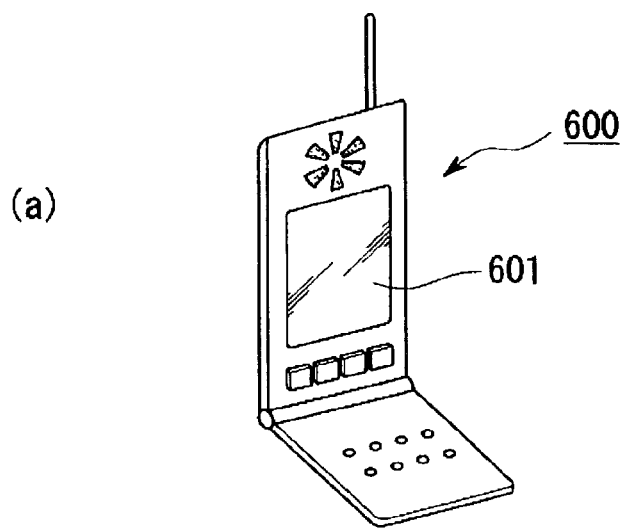
FIGS. 10(a)-10(c) show electronic apparatuses according to a fourth embodiment of the present invention: where
Figure 10:
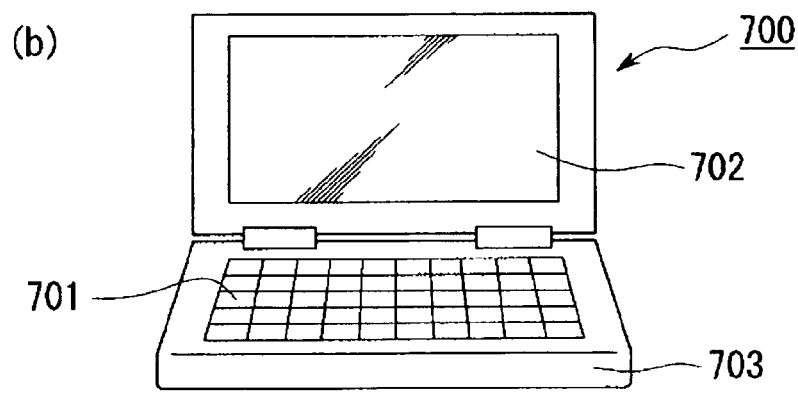
Figure 10:
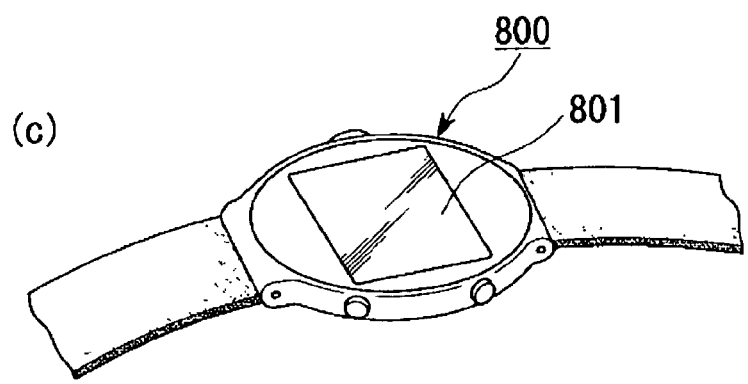

FIG. 10(a) is a perspective view of a cellular phone. In FIG. 10(a), reference numeral 600 designates a body of the cellular phone, and reference numeral 601 designates a liquid crystal display including a liquid crystal device according to the second embodiment.

FIG. 10(b) is a perspective view of portable information processing equipment, such as a word processor and a personal computer, for example. In FIG. 10(b), reference numeral 700 designates information processing equipment, and reference numerals 701, 703, and 702 designate an input region such as a keyboard, a body of the information processing equipment, and a liquid crystal display including a liquid crystal device according to the second embodiment, respectively.

FIG. 10(c) is a perspective view of a wristwatch-type electronic apparatus. In FIG. 10(c), reference numeral 800 designates a body of a wristwatch, and reference numeral 801 designates a liquid crystal display including a liquid crystal device according to the second embodiment.

Since the electronic apparatuses shown in FIGS. 10(a) to 10(c) have the liquid crystal devices according to the above-described embodiment, broken wires and short circuits hardly occur, and besides, downsized, low-profile apparatuses can be achieved.

The electronic apparatuses of the present embodiment each have a liquid crystal device; however, they may have an organic electroluminescence display device, a plasma display device, or any other electro-optic device.

Fifth Embodiment

Figure 11:
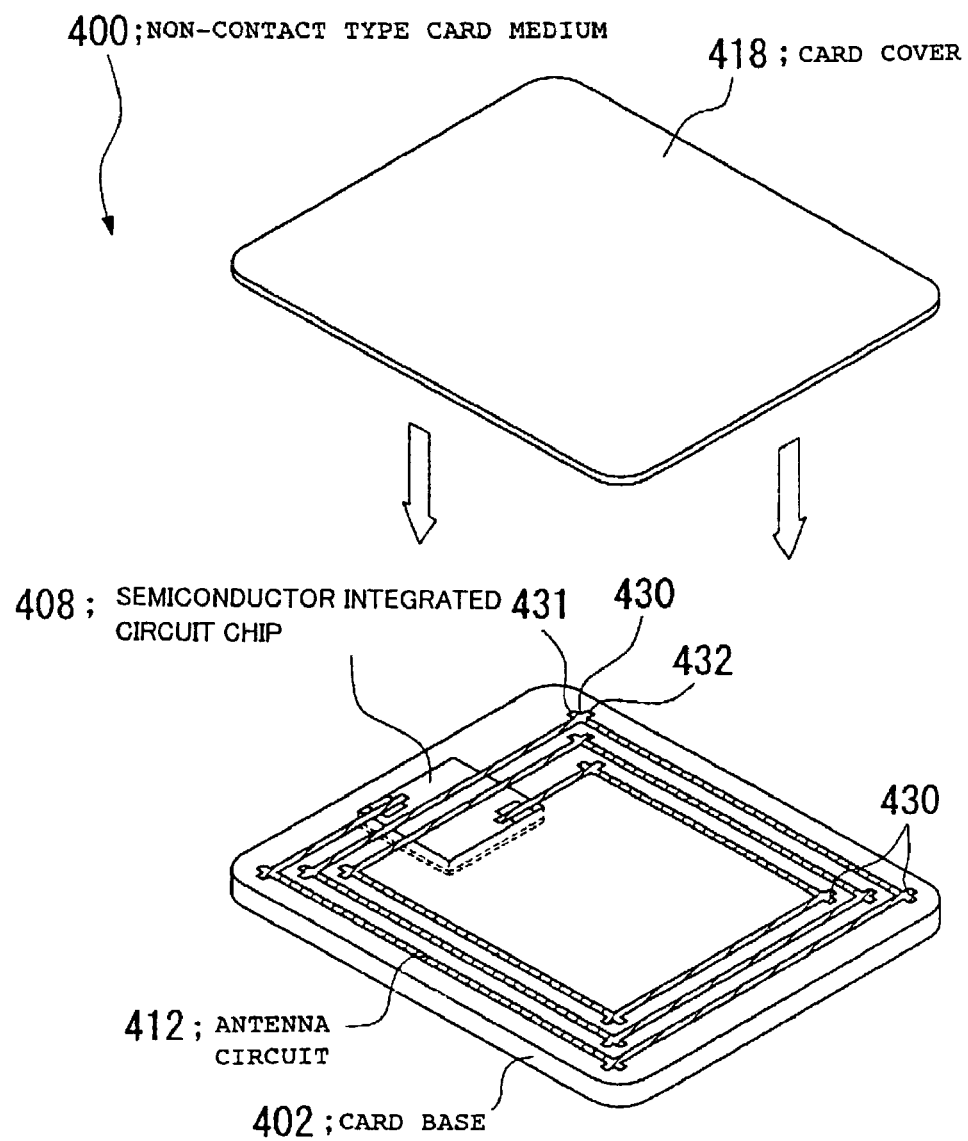
FIG. 11 is a fragmentary perspective view of a non-contact type card medium according to a fifth embodiment of the present invention.

As for a fifth embodiment, an exemplary non-contact type card medium of the present invention is described below. In a non-contact type card medium 400 of the present invention, as shown in FIG. 11, a housing including a card base 402 and a card cover 418 contains a semiconductor integrated circuit chip 408 and an antenna circuit 412 formed in a rectangular spiral. Thus, the non-contact type card medium 400 and an external transmitter receiver, not shown in FIG. 11, perform at least one of power supply and data communication therebetween, using at least one of an electromagnetic wave and capacitive coupling.

In this embodiment, the rectangular-spiral antenna circuit 412 is disposed by the method for forming a line pattern according to the first embodiment, and has protrusions 431 and 432 at each corner 430.

Since the antenna circuit 412 in the non-contact type card medium of the present invention has the two protrusions 431 and 432 at each corner thereof, broken wires and short circuits hardly occur, and besides, a miniaturized, low-profile card medium can be achieved.

EXAMPLE 1

Xylene was added to a disperse liquid ("Perfect Gold" manufactured by Vacuum Metallurgical Co., Ltd.), prepared by gold particles of 10 nm in diameter dispersed in toluene, to prepare a liquid having a viscosity of 3 cP. The liquid was deposited on a polyimide film coated on a glass substrate with an ink jet printing device, and thus a line pattern was formed. The surface of the polyimide film had been subjected to Teflon (registered trade mark) treatment in advance. As the ink jet head, a head for a commercially available printer (product name: "MJ930C") was used. However, since the portion to suction ink was formed of a plastic, the suctioning portion was replaced with a metal fixing to reduce or prevent the organic liquid disperse medium from dissolving the suctioning portion.

Figure 12:
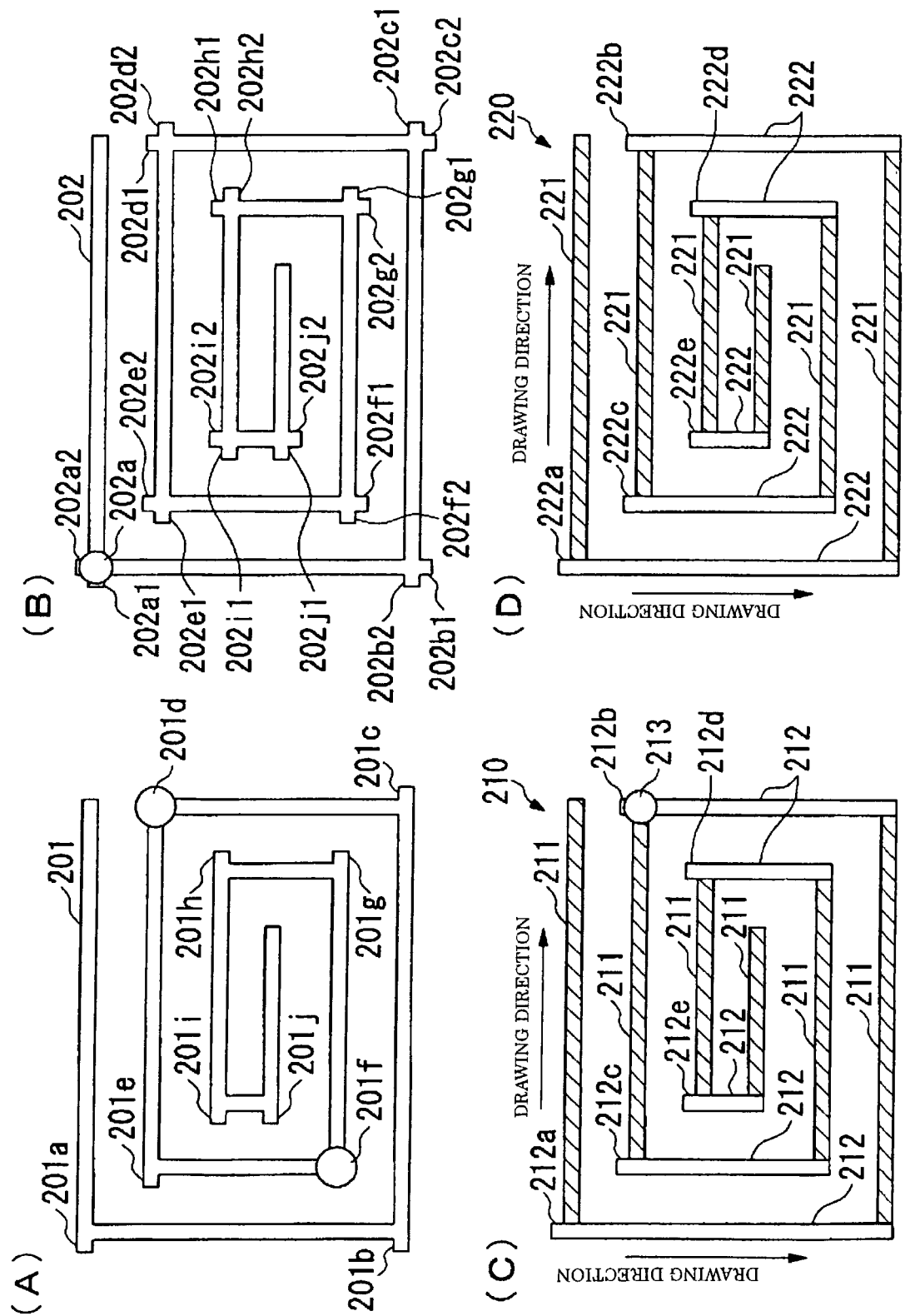
FIGS. 12(a)-12(d) are schematic plan views of a conductive-film interconnecting pattern formed in an example of the present invention.

The pattern to be drawn was a spiral pattern 201, as shown in FIG. 12(A).

The pattern was drawn by reciprocating the stage in the large length direction, and by discharging the liquid while the ink jet head was moved, for every stage reciprocation, in the direction perpendicular to the direction of the stage reciprocation. By simultaneously discharging the liquid from a plurality of nozzles, a plurality of lines in the large length direction and short length direction were simultaneously deposited for every reciprocation of the stage. The width of the lines was all 150 μm. Only the lines extending in the large length direction were drawn so as to have protrusions (201a to 201j) of 100 μm in length at each of ten corners with respect to the short length direction. As a result, relatively small bulges, or pools, (201d and 201f) occurred at two corners out of the ten corners, but the other corners did not exhibit bulges. After the drawing, the substrate was fired at 300° C., and thus a gold interconnecting pattern was completed.

EXAMPLE 2

Using the same liquid, ink jet head, and substrate as in Example 1, a spiral pattern 202 shown in FIG. 12(B) was formed. By simultaneously discharging the liquid from a plurality of nozzles, as in Example 1, a plurality of lines in the large length direction and short length direction were simultaneously deposited for every reciprocation of the stage. The lines extending in both large length and short length directions were drawn so as to have protrusions (202a1, 202a2 to 202j1, and 202j2) of 100 μm in length at each corner. As a result, a relatively small bulge, or pool, (202a) occurred at one corner out of the ten corners, but the other corners did not exhibit bulges. After the drawing, the substrate was fired at 300° C., and thus a gold interconnecting pattern was completed.

EXAMPLE 3

Under the same conditions as in Example 1, a spiral pattern 210 shown in FIG. 12(C) was formed. By discharging the liquid from a single nozzle, a single line (211) was drawn in the large length direction for every one reciprocation of the stage. After all lines in the large length direction were drawn, the substrate was dried at 200° C. for 5 minutes with a hot plate. Then, the substrate was reset on the stage, and a single line (212) in the short length direction was formed for every one reciprocation of the stage. The lines in the short length direction were drawn such that the liquid was deposited from a starting point outside the previously formed lines in the large length direction so as to have protrusions (212*a* to 212*e*) of 100 μm in length. As a result, a small bulge (pool) 213 occurred at one out of the ten corners, but the other corners did not exhibit bulges. After the drawing, the substrate was fired at 300° C., and thus a gold interconnecting pattern was completed.

EXAMPLE 4

Under the same conditions as in Example 1, a spiral pattern 220 shown in FIG. 12(D) was formed. By discharging the liquid from a single nozzle, a single line 221 was drawn in the large length direction for every one reciprocation of the stage. After all lines in the large length direction were drawn, the substrate was fired at 300° C. for 30 minutes with a hot plate to transform the lines into a metal film. Then, the substrate was reset on the stage, and a single line 222 in the short length direction was formed for every one reciprocation of the stage. The lines in the short length direction were drawn such that the liquid was deposited from a starting point outside the previously formed lines in the large length direction so as to have protrusions (222*a* to 222*e*) of 100 μm in length. As a result, all the ten corners exhibited no bulges.

COMPARATIVE EXAMPLE 1

Figure 13:
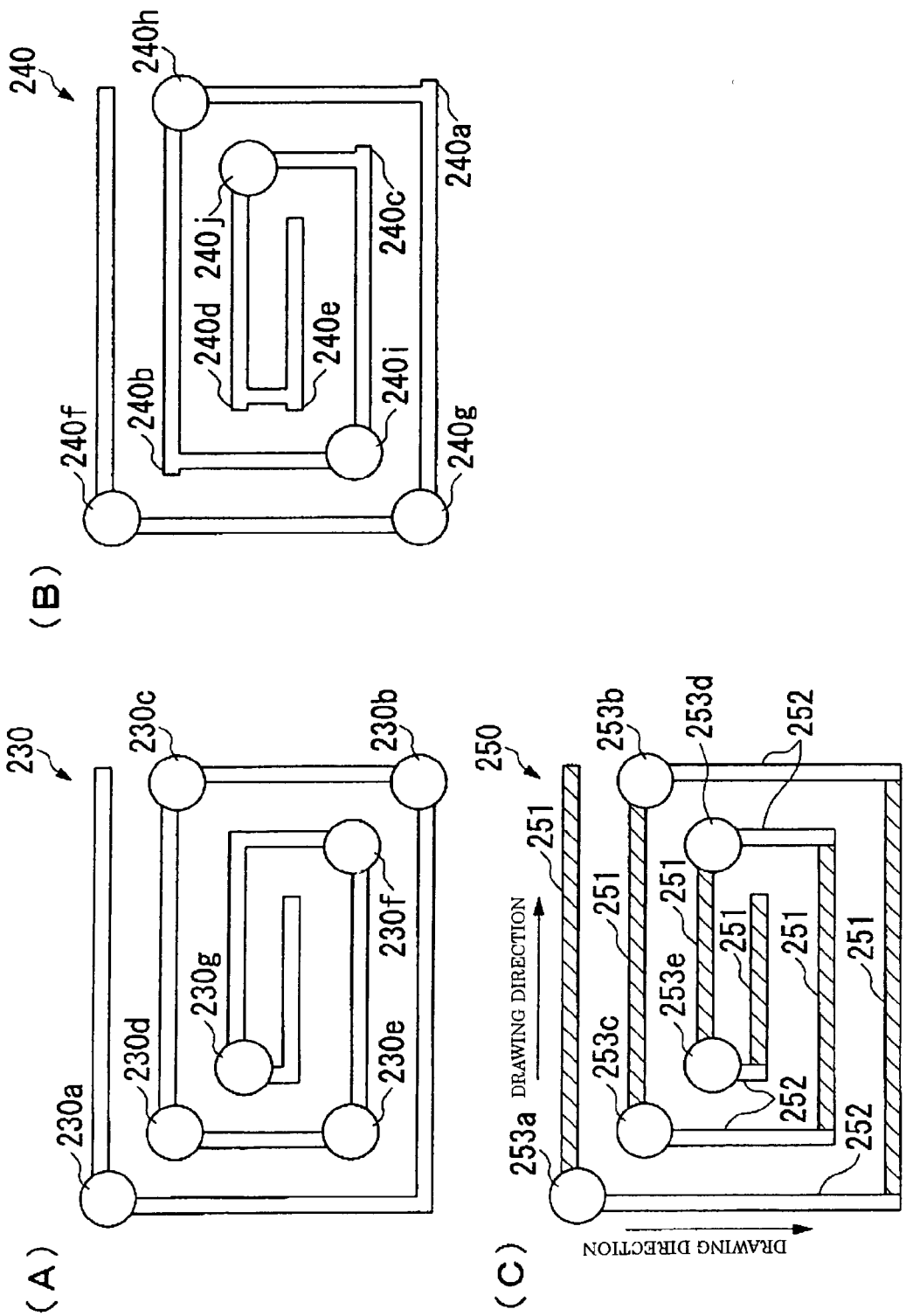
FIGS. 13(a)-13(c) are schematic plan views of a conductive-film interconnecting pattern formed in a comparative example of the present invention.
Figure 14:
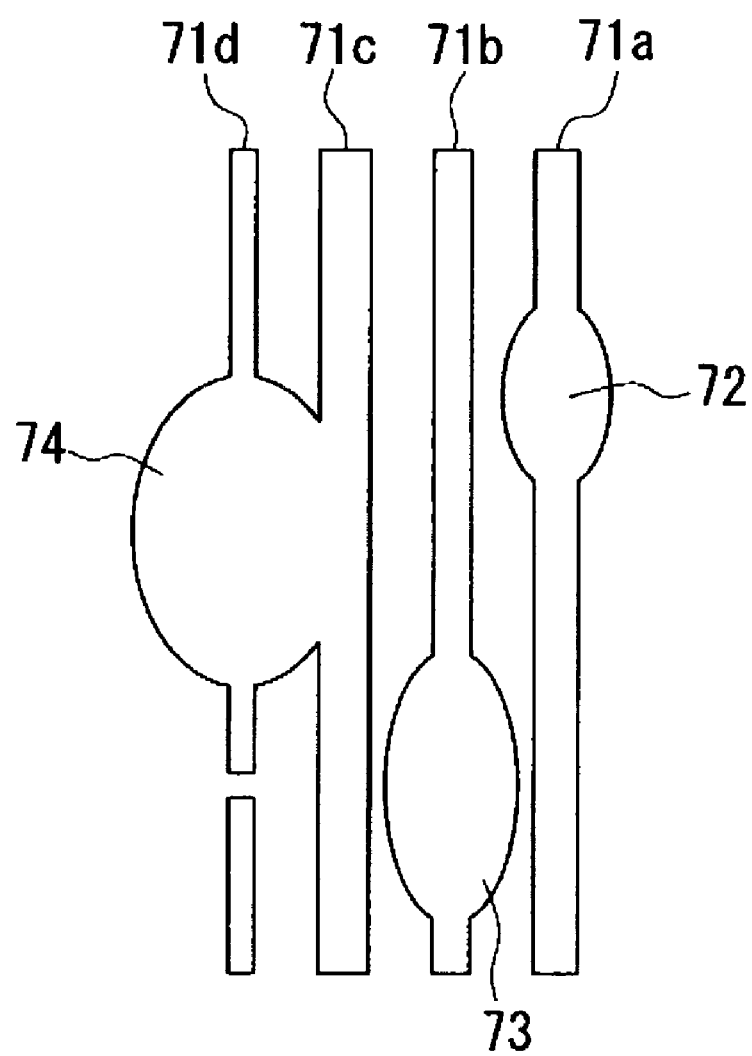
FIG. 14 is a schematic of bulges in lines formed by ink jet printing.

Under the same conditions as in Example 1, a spiral pattern 230 shown in FIG. 13(A) was formed. By simultaneously discharging the liquid from a plurality of nozzles, the lines in the large length direction and the short length direction were simultaneously formed. The liquid was deposited so as to form no protrusions at any of the ten corners. As a result, relatively large bulges (230*a* to 230*e*) occurred at seven out of the ten corners. The lines were fired at 300° C. for 30 minutes with a hot plate to complete a gold interconnecting pattern. However, broken wires were exhibited at five out of the corners where bulges, or pools, (230*a* to 230*c*) had occurred.

COMPARATIVE EXAMPLE 2

Under the same conditions as in Example 1, a spiral pattern 240 shown in FIG. 13(B) was formed. By simultaneously discharging the liquid from a plurality of nozzles, the lines in the large length direction and the short length direction were simultaneously formed. The lines were drawn such that only the lines extending in the large length direction have protrusions (240*a* to 240*e*) of 50 μm in length (one third of the line width) at each corner with respect to the lines in the short length direction. As a result, relatively small bulges, or pools, (240*f* to 240*j*) occurred at five out of the ten corners.

COMPARATIVE EXAMPLE 3

Under the same conditions as in Example 1, a spiral pattern 250 shown in FIG. 13(C) was formed. By discharging the liquid from a single nozzle, a single line 251 was drawn in the large length direction for every one reciprocation of the stage. After all lines in the large length direction were drawn, the substrate was fired at 300° C. for 30 minutes with a hot plate to transform the lines into a metal film. Then, the substrate was reset on the stage, and a single line 252 in the short length direction was formed for every one reciprocation of the stage. Lines in the short length direction were formed such that the liquid was deposited from starting points overlapping with the previously formed lines in the large length direction. As a result, all the five corners which were the starting points of the lines of the short length direction exhibited large bulges, or pools, (253*a* to 253*e*). After the drawing, the lines were fired at 300° C. for 30 minutes with a hot plate to complete a gold interconnecting pattern. However, broken wires were exhibited at all the corners where bulges had occurred.

ADVANTAGES

According to the present invention, a method for reliably forming a conductive-film interconnecting pattern without or substantially without or reduced irregularities, such as broken wires and shot circuits resulting from liquid bulges, in simplified processes can be provided.

Also, according to the present invention, a miniaturized, low-profile electro-optic device, and an electronic apparatus using the electro-optic device and a non-contact type card medium can be achieved which hardly exhibit brakes in wires and antennas and short circuits.

What is claimed is:

1. A method of forming a wiring formed substrate, the method comprising:
   forming a first film on the substrate;
   forming a second film on the substrate, the second film intersecting with the first film at a first intersecting point, a portion of the first film between a second edge of the first film and the first intersecting point being a first protruding portion, a first portion of the second film between a first edge of the second film and the first intersecting point being a second protruding portion;
   forming a third film on the substrate, the third film intersecting with the second film at a second intersecting point, a second portion of the second film between a second edge of the second film and the second intersecting point being a third protruding portion, a first portion of the third film between a first edge of the third film and the second intersecting point being a fourth protruding portion; and
   heating the first, the second, and the third films to form a wiring.

2. A method of forming a wiring formed substrate, the method comprising:
   forming a circuit on a substrate;
   forming a first film on the substrate, a first edge of the first film contacting the circuit;
   forming a second film on the substrate, the second film intersecting with the first film at a first intersecting point, a portion of the first film between a second edge of the first film and the first intersecting point being a first protruding portion, a first portion of the second film between a first edge of the second film and the first intersecting point being a second protruding portion;

forming a third film on the substrate, the third film intersecting with the second film at a second intersecting point, a second portion of the second film between a second edge of the second film and the second intersecting point being a third protruding portion, a first portion of the third film between a first edge of the third film and the second intersecting point being a fourth protruding portion; and heating the first, the second, and the third films to form a wiring.

3. The method of forming the wiring formed substrate according to claim 2, the forming of the first film including applying a plurality of droplets to form a first applied film and evaporating the first applied film.

4. The method of forming the wiring formed substrate according to claim 2, a process of forming each of the first, the second, and the third films including applying a plurality of droplets from a head of an inkjet apparatus to form an applied film and evaporating the applied film.

5. The method of forming the wiring formed substrate according to claim 2, each of the first, the second, and the third films being a dried film.

6. The method of forming the wiring formed substrate according to claim 2, the first, the second, and the third films including a plurality of metal particles.

7. The method of forming the wiring formed substrate according to claim 2, a length of the first protruding portion being at least two-thirds a width of the first film.

8. The method of forming the wiring formed substrate according to claim 2, a length of the first protruding portion being at least one-half a width of the first film.

9. The method of forming the wiring formed substrate according to claim 2, each of the first, the second, and the third films being in the form of a line.

10. The method of forming the wiring formed substrate according to claim 2, the wiring being one of a plurality of data lines that is formed between a plurality of pixel electrodes, each of the first, the second, the third, and the fourth protruding portions not contacting to any of the plurality of pixel electrodes.

11. A method of forming a wiring formed substrate, the method comprising:

forming a circuit on a substrate;

forming a first film on the substrate;

forming a second film on the substrate, the second film intersecting with the first film at a first intersecting point, a portion of the first film between a second edge of the first film and the first intersecting point being a first protruding portion, a first portion of the second film between a first edge of the second film and the first intersecting point being a second protruding portion;

forming a third film on the substrate, the third film intersecting with the second film at a second intersecting point, a second portion of the second film between a second edge of the second film and the second intersecting point being a third protruding portion, a first portion of the third film between a first edge of the third film and the second intersecting point being a fourth protruding portion, a second edge of the third film contacting the circuit; and heating the first, the second, and the third films to form a wiring.

\* \* \* \* \*